United States Patent [19]

Ryan

[11] Patent Number: 4,816,775

[45] Date of Patent: Mar. 28, 1989

[54] NEGATIVE FEEDBACK, PHASE ROTATION, PHASE ACQUISITION AND TRACKING APPARATUS AND METHOD

[75] Inventor: Carl R. Ryan, Gilbert, Ariz.

[73] Assignee: Motorola, Inc., Schaumburg, Ill.

[21] Appl. No.: 106,073

[22] Filed: Oct. 8, 1987

[51] Int. Cl.$^4$ ............................................. H03L 7/10
[52] U.S. Cl. ...................................... 331/12; 331/17; 331/25
[58] Field of Search ...................... 331/11, 12, 17, 25; 329/124; 375/120; 328/155

[56] References Cited

U.S. PATENT DOCUMENTS

| | | | |
|---|---|---|---|
| 4,085,378 | 4/1978 | Ryan et al. | 329/124 |
| 4,359,692 | 11/1982 | Ryan | 329/50 |
| 4,652,834 | 3/1987 | McAdam | 329/50 |

*Primary Examiner*—Siegfried H. Grimm

*Attorney, Agent, or Firm*—Frank J. Bogacz

[57] ABSTRACT

A phase acquisition and tracking apparatus in which a phase difference between a reference signal and a signal to be acquired is rotated within a negative feedback loop so that such phase difference disappears is disclosed. In another embodiment, a baseband signal which is influenced by such a phase difference is rotated within a negative feedback loop so that the phase difference disappears. The phase rotated signal serves as an output signal from the phase acquisition and tracking apparatus, and this output signal faithfully and rapidly reproduces the input signal regardless of any particular value of such phase difference. Since a negative feedback loop is used to control the amount of phase rotation, non-linearities and other errors produced by multipliers, summing devices and combining circuits are automatically compensated for through the feedback.

18 Claims, 5 Drawing Sheets

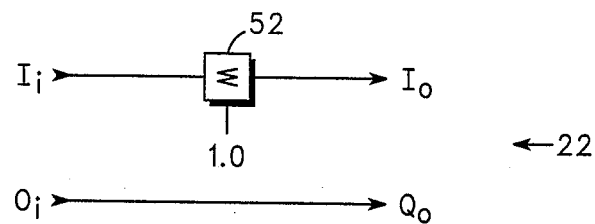
FIG. 6A
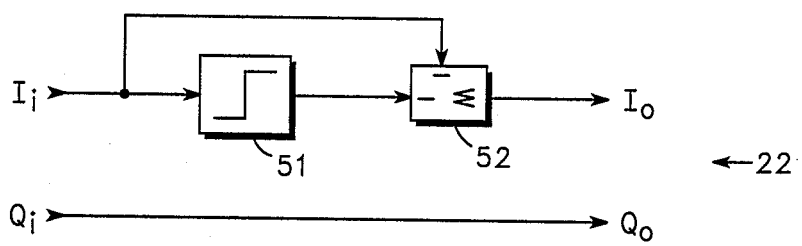
FIG. 6B
FIG. 6C
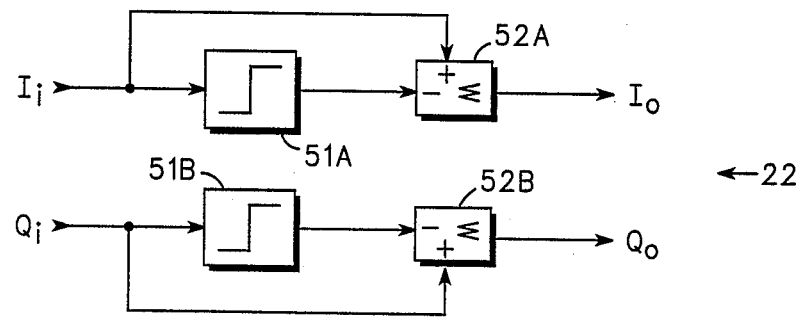

NEGATIVE FEEDBACK, PHASE ROTATION, PHASE ACQUISITION AND TRACKING APPARATUS AND METHOD

Background of the Invention

This invention generally relates to phase acquisition circuits which acquire or lock onto an input signal. Specifically, the present invention relates to phase locked and frequency locked loop circuits. More specifically, the present invention relates to a phase locked loop circuit which exhibits a rapid acquisition time.

Conventional phase locked loop circuits exhibit a widely variable lock up or acquisition time parameter. Worst case acquisition times are typically much slower than loop bandwidth would predict based on a linear model of a conventional phase locked loop. This widely variable acquisition time results from a quasi-stable, or "hang-up" point associated with conventional phase locked loop circuits. The quasi-stable point occurs when the phase of a reference signal provided by a free running oscillator or VCO of the conventional phase locked loop is approximately 180° out of phase with an input signal being acquired. Near this quasi-stable point the control circuit fails to accurately influence direction of VCO frequency change. Thus, at or near this quasi-stable point the VCO may not change frequency toward the frequency of the input signal and may actually change frequency away from the frequency of the input signal. Resultingly, acquisition time is somewhat unpredictable and typical acquisition time is slower than would occur if the quasi-stable point were eliminated.

One solution toward improving acquisition time is shown in U.S. Pat. No. 4,359,692 entitled "Rapid Acquisition Shift-Keyed Signal Demodulator" by Carl R. Ryan, issued Nov. 16, 1982. This solution estimates and compensates for the initial phase difference in an open loop design. Since this solution utilizes an open loop design, non-linearities and other errors in the estimation and compensation circuitry cause errors in the resulting output.

SUMMARY OF THE INVENTION

Accordingly, it is an object of the present invention to provide a phase acquisition and tracking circuit which exhibits an improved acquisition time parameter.

Another object of the present invention concerns providing a phase acquisition and tracking circuit which eliminates the quasi-stable or "hang-up" point that characterizes conventional phase-locked loops.

Yet another object of the present invention concerns providing a phase acquisition and tracking circuit in which the circuit output signal is not a function of the phase difference between a reference signal and an input signal.

Still another object of the present invention concerns providing a phase acquisition and tracking circuit which uses error estimation and phase difference compensation in a closed loop, negative feedback, design.

Yet another object of the present invention concerns providing a phase acquisition and tracking circuit that does not require a conventional voltage controlled oscillator when utilized in connection with many phase acquisition and tracking applications.

The above and other objects and advantages of the present invention are carried out in one form by an input signal acquiring apparatus in which a phase rotator has a first input which is adapted to receive either the input signal or a signal generated from the input signal. The phase rotator additionally has a second input receiving a feedback signal which controls the amount of phase rotation the signal applied at the first input experiences in a rotated signal output from the phase rotator. The rotated signal is modified by being coupled through a phase error estimator, then input to a first input of a phase error combiner. A second input of the phase error combiner couples to the first input of the phase rotator, and an output of the combiner substantially generates the feedback signal.

BRIEF DESCRIPTION OF THE DRAWINGS

A more complete understanding of the present invention may be derived by referring to the detailed description and claims when considered in connection with the accompanying drawings, wherein like reference numbers throughout the drawings indicate similar features, and wherein:

FIGS. 6a–6c show various examples of a phase error estimator portion of the FIG. 5 embodiment.

DETAILED DESCRIPTION OF THE PREFERRED EMBODIMENTS

Figure 1:
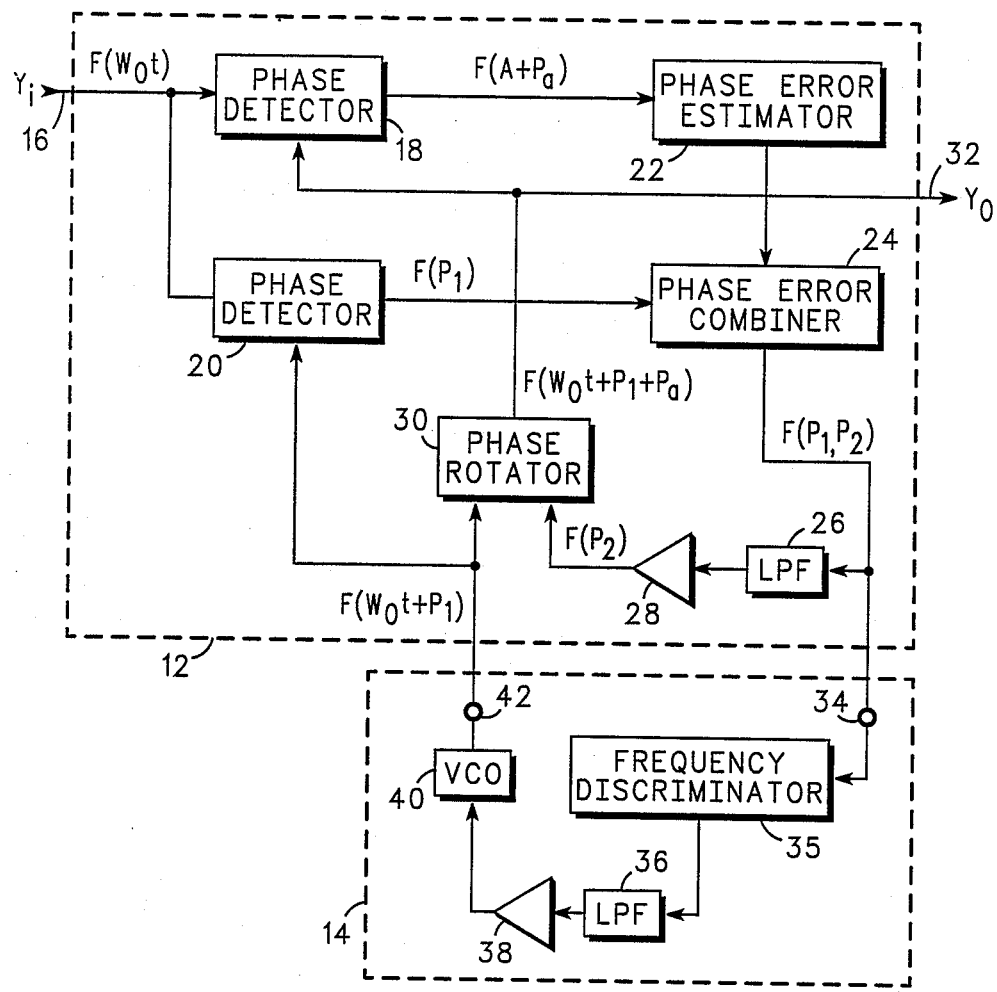
FIG. 1 shows a simplified block diagram of one embodiment of the present invention.

In the FIG. 1 simplified block diagram of one embodiment of the present invention, a phase acquisition and tracking apparatus 10 is characterized as having an inner loop 12 and an optional outer feedback path 14. Inner loop 12 forms a relatively fast negative feedback loop which is used to rotate a phase. Outer feedback path 14 together with portions of inner feedback loop 12 form a relatively slower negative feedback loop which is used to adjust a reference frequency.

Referring to inner loop 12, an input signal is applied at a terminal 16 which couples to a signal input of a phase detector 18 and a signal input of a phase detector 20. An output of phase detector 18 couples to an input of a phase error estimator 22. An output of phase error estimator 22 couples to a first input of a phase error combiner 24, and an output of phase detector 20 couples to a second input of phase error combiner 24. An output of phase error combiner 24 couples to a terminal 34 and to an input of a low pass filter 26. An output of low pass filter 26 couples to an input of an amplifier 28, and an output of amplifier 28 couples to a control input of a phase rotator 30.

A reference signal is applied at a terminal 42 from outer feedback path 14, or another source (not shown) if outer feedback path 14 has been omitted. Terminal 42 couples to a reference input of phase detector 20 and a reference input of phase rotator 30. An output of phase rotator 30 couples to a reference input of phase detector 18 and to a terminal 32 which supplies an output signal $Y_o$ from acquisition and tracking apparatus 10.

Referring to outer feedback path 14, terminal 34 couples to an input of a frequency discriminator 35. An output of frequency discriminator 35 couples to an input of a low pass filter 36, and an output of low pass filter 36 couples to an input of an amplifier 38. An output of amplifier 38 couples to a control input of a variable frequency oscillator, such as voltage controlled oscillator (VCO) 40. An output of VCO 40 couples to terminal 42. The components and connections utilized in outer feedback path 14 represent components and connections which are conventionally used in phase locked and frequency locked loops. However, in applications where the frequency of the input signal is sufficiently close to a reference frequency provided by another source (not shown) outer feedback path 14 is not required, and the need for VCO 40 is eliminated.

In a conventional phase locked loop, an output signal is a function of the relative phase angle between a reference signal provided by a VCO and an input signal. By referring to a signal as being a function of certain parameters, those skilled in the art will understand that output changes of this signal occur in response to changes in one or more of the input parameters. In other words, values exhibited by the output signal may be attributed to the relative phase difference between the reference signal and the input signal.

In order to eliminate the quasi-stable point, the present invention seeks to provide an output signal $Y_o$ which is not a function of this relative phase difference. In other words, in the present invention values exhibited by output signal $Y_O$ at terminal 32 are generally not attributed to the relative phase difference between the reference signal supplied by VCO 40 at terminal 42 and the input signal applied at terminal 16.

A simplified view of the operation of the present invention results from considering the use of apparatus 10 in an application where the input signal to be acquired substantially represents a sine wave exhibiting a frequency of $w_o$. Thus, the input signal may be considered a function of the frequency $w_o$, or $F(w_o)$, at an instant in time or over a short period of time. The reference signal output from VCO 40 may be expressed as a function of $w_o$, time and a phase angle $p_1$, or $F(w_ot+p_1)$. Phase detector 20 compares phase between the input signal and the reference signal and outputs a baseband first phase error signal which is a function only of phase difference $p_1$, or $F(p_1)$. Thus, phase detector 20 operates similarly to a phase detector in a conventional phase locked loop.

Phase rotator 30 receives a control signal which is a function of a phase angle $p_2$, or $F(p_2)$. Phase rotator 30 generates a rotated reference signal that may be characterized as exhibiting the frequency $w_o$ at a relative phase $p_1$ and further rotated by an additional phase angle of $p_2$. In other words, the rotated reference signal is a function of $w_ot+p_1+p_2$, or $F(w_ot+p_1+p_2)$. Phase detector 18 converts the input signal to baseband and outputs a net phase error signal which is a function of $p_1+p_2$, or $F(p_1+p_2)$.

Phase error combiner circuit 24 inputs the net phase error signal adjusted by a phase error estimation (discussed below) and the first phase error signal to generate a feedback signal which is a function of $p_1$ and $p_2$, or $F(p_1,p_2)$. Combination circuit 24 causes phase angles $p_1$ and $p_2$ to cancel each other out in the rotated reference signal output from phase rotator 30. Thus, the output signal $Y_o$ at terminal 32 is a function of only $w_ot$, or $F(w_ot)$. No quasi-stable point occurs in the acquisition of the input signal because this output is not a function of the phase between VCO 40 and the input signal.

The time constant of inner loop 12 is controlled substantially by low pass filter 26, and the time constant of the outer loop is substantially controlled by low pass filter 36 in outer feedback path 14. The time constant of inner loop 12 is adjusted to be substantially faster than the time constant of the outer loop so that the inner and outer loops are allowed to work in harmony with each other.

Figure 2:
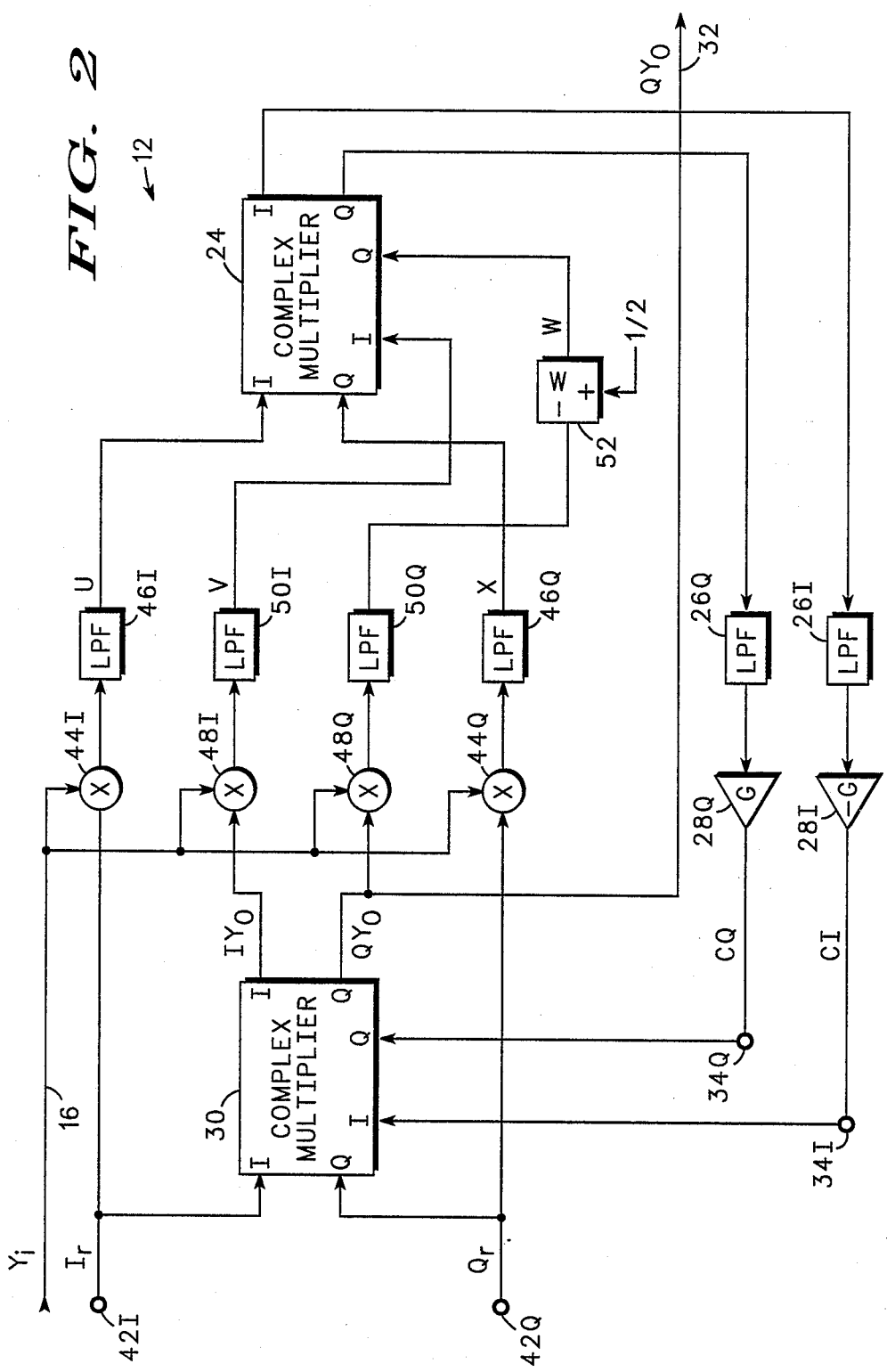
FIG. 2 shows a block diagram of the FIG. 1 embodiment of the present invention.

FIG. 2 shows a specific implementation of one embodiment of inner loop 12 from FIG. 1. In this embodiment, the reference signal represents a complex signal having an in-phase component $I_r$ and a quadrature component $Q_r$ which may be supplied from either VCO 40 (see FIG. 1) or another source. Thus, the reference signal is applied at terminals 42I and 42Q with in-phase portion $I_r$ at terminal 42I and quadrature portion $Q_r$ at terminal 42Q. Terminal 42I couples to a first in-phase input of a complex multiplier 30 and to a first input of a multiplier 44I. Terminal 42Q couples to a first quadrature input of complex multiplier 30 and to a first input of multiplier 44Q. An in-phase output of complex multiplier 30 couples to a first input of a multiplier 48I, and a quadrature output of complex multiplier 30 couples to a first input of a multiplier 48Q.

Terminal 16 couples to second inputs of multipliers 44I, 48I, 48Q, and 44Q. An output from multiplier 44I couples to an input of a low pass filter 46I, an output from multiplier 48I couples to an input of a low pass filter 50I, an output of multiplier 48Q couples to an input of low pass filter 50Q, and an output of multiplier 44Q couples to an input of low pass filter 46Q. An output of low pass filter 46I couples to a first in-phase input of a complex multiplier 24, an output of low pass filter 50I couples to a second in-phase input of complex multiplier 24, and an output of low pass filter 46Q couples to a first quadrature input of complex multiplier 24. An output of low pass filter 50Q couples to a minus input of a summing device 52, and a bias of $\frac{1}{2}$ unit couples to a + input of summing device 52. An output of summing device 52 couples to a second quadrature input of complex multiplier 24.

An in-phase output of complex multiplier 24 couples to an input of low pass filter 26I, and a quadrature output of complex multiplier 24 couples to an input of low pass filter 26Q. An output of low pass filter 26I couples to an input of amplifier 28I, and an output of low pass filter 26Q couples to an input of amplifier 28Q. In the present embodiment, amplifier 28I exhibits a negative gain while amplifier 28Q exhibits a positive gain. An output of amplifier 28I couples to a terminal 34I and to a second in-phase input of complex multiplier 30. An output of amplifier 28Q couples to a terminal 34Q and a second quardrature input of complex multiplier 30.

Figure 3:
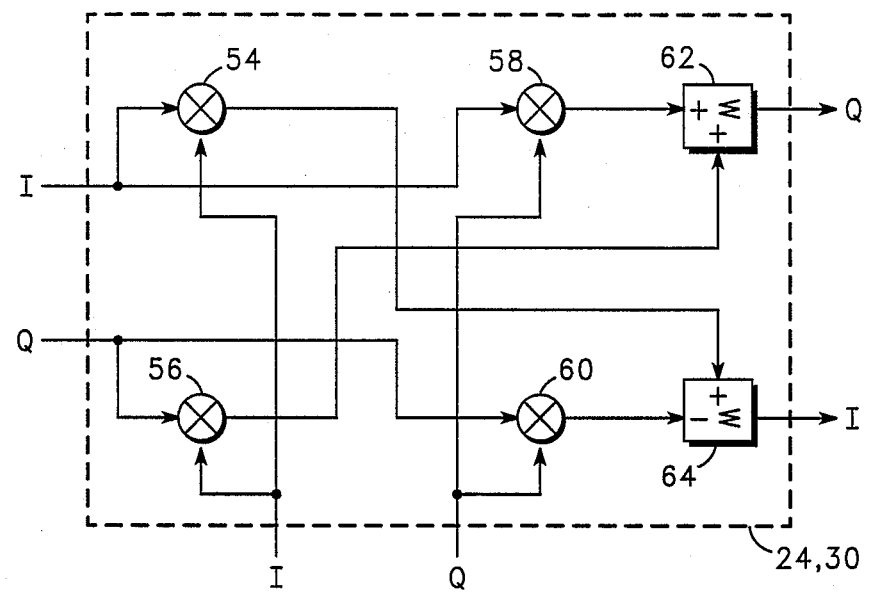
FIG. 3 shows a block diagram of a full complex multiplier utilized by the embodiment of the present invention shown in FIG. 2.

Complex multipliers 24 and 30 utilized in the FIG. 2 embodiment of the present invention are described in more detail in FIG. 3. Referring to FIG. 3, the first in-phase input of the complex multiplier couples to first inputs of multipliers 54 and 58. Likewise, the first quadrature input couples to a first input of a multiplier 56 and a first input of a multiplier 60. The second in-phase input couples to second inputs of multipliers 54 and 56, and the second quadrature input couples to second inputs of multipliers 58 and 60. Outputs of multipliers 56 and 58 provide quadrature signals which are summed together in a summing device 62. The output of summing device 62 provides the quadrature output of the complex multiplier. Similarly, the output of multiplier 54 couples to a positive input of a summing device 64, and an output of multiplier 60 couples to a negative input of summing device 64. The result of this summing operation is provided at an output of summing device 64 and represents the in-phase output from the complex multiplier.

In the FIG. 2 embodiment of the present invention, complex multiplier 30 performs the function of phase rotator 30 (see FIG. 1). Thus, the reference signal is applied at the first inputs of complex multiplier 30, a control signal is applied at the second inputs of complex multiplier 30, and the outputs of complex multiplier 30 provide the rotated reference signal. Furthermore, the quadrature output from complex multiplier 30 couples to terminal 32 and provides output signal $QY_o$.

Multipliers 44 and low pass filters 46 provide the first phase detector function described above in connection with FIG. 1. Thus, signals U and X generated at the outputs of low pass filters 46I and 46Q, respectively, represent in-phase and quadrature components of the first phase error signal discussed above in connection with FIG. 1. Likewise, multipliers 48 and low pass filters 50 represent phase comparator 18 described above in connection with FIG. 1. Signals V and W output from low pass filter 50I and summing device 52, respectively, represent in-phase and quadrature components of the net phase error signal discussed above in connection with FIG. 1. In the present embodiment, low pass filters 46 and 50 each exhibit cut off frequencies at approximately an anticipated frequency of the input signal applied at terminal 16. Consequently, filters 46 and 50 remove double frequency components of the signals produced by multipliers 44 and 48, respectively, while allowing baseband signals to pass.

In the FIG. 2 embodiment of the present invention, complex multiplier 24 represents phase error combiner 24 shown in FIG. 1. Thus, the outputs from complex multiplier 24 provide a feedback signal which is filtered in low pass filters 26 and amplified in amplifiers 28 before being applied as a control signal to the second inputs of complex multiplier 30.

The location of terminals 34 in the FIG. 2 embodiment of the present invention differs from the location as shown in FIG. 1. This difference in location simply demonstrates that the inputs to outer feedback path 14 (see FIG. 1) may be derived from any one of several different locations within inner feedback loop 12. The location of terminals 34 as shown in FIG. 2 may allow outer feedback path 14 to refrain from using an additional inverter, but could reduce flexibility in control of the outer feedback loop by locating low pass filters 26 and amplifiers 28 within both the outer feedback loop and inner feedback loop 12.

A sine wave input signal received at terminal 16 of this embodiment of the present invention may be characterized as:

$$Y_i = a\sin(w_o t) \quad (1)$$

where "a" represents the amplitude of the input signal. Likewise, the reference signal applied at terminals 42I and 42Q may instantaneously or over a very short period of time be described as having in-phase and quadrature components:

$$I_r = \sin(w_o t + p_1)$$

$$Q_r = \cos(w_o t + p_1) \quad (2)$$

where $I_r$ and $Q_r$ represent the in-phase and quadrature components, respectively, and $p_1$ represents an arbitrary phase difference between the reference signal and the input signal $Y_i$.

Control signals output from amplifiers 28I and 28Q may be defined as:

$$CI = A\sin(p_2)$$

$$CQ = A\cos(p_2). \quad (3)$$

CI represents the in-phase control signal and CQ represents the quadrature control signal. A and $p_2$ represent variables which are supplied by inner loop 12. As a result of the four quadrant, or full complex, multiplication performed in complex multiplier 30, a rotated reference signal results which may be characterized as:

$$IY_o = -A\cos(w_o t + p_1 + p_2)$$

$$QY_o = A\sin(w_o t + p_1 + p_2). \quad (4)$$

$IY_o$ represents the in-phase output signal from complex multiplier 30 and $QY_o$ represents the quadrature output signal from complex multiplier 30.

By using equations (1) and (2), the first phase error signal may be expressed as:

$$U = (a/2)\cos(p_1)$$

$$X = (-a/2)\sin(p_1). \quad (5)$$

Using equations (1) and (4), the net phase error signal may be represented as:

$$V = (aA/2)\sin(p_1 + p_2)$$

$$W = \tfrac{1}{2} - (aA/2)\cos(p_1 + p_2) \quad (6)$$

Complex multiplier 24 then combines the first phase error and net phase error signals to provide a feedback signal which is filtered in low pass filters 26 and amplified in amplifiers 28 to provide a control signal as follows:

$$CI = (-Ga/4)[\sin(p_1) + aA\sin(p_2)]$$

$$CQ = (Ga/4)[\cos(p_1) - aA\cos(p_2)] \quad (7)$$

where G represents the gain of each of amplifiers 28. By combining equations (3) and (7), the variables A and $p_2$ are resolved as follows:

$$A = Ga/(4 + Ga^2)$$

$$p_2 = -p_1. \quad (8)$$

By substituting equations (8) back into equations (4), the output signal $QY_o$ supplied at terminal 32 can be characterized as:

$$QY_o = [Ga/(4 + Ga^2)]\sin(w_o t). \quad (9)$$

Consequently, so long as the quantity Ga is positive, output signal $QY_o$ exhibits the same polarity as input signal $Y_i$. Furthermore, output signal $QY_o$ is not a function of phase angles $p_1$ or $p_2$. Since phase angle $p_1$ does not influence output signal $QY_o$, a quasi-stable point, which would be a function of phase angle, is not exhibited by inner loop 12. Resultingly, a faster acquisition time characterizes inner loop 12 than characterizes circuits having a quasi-stable or "hang-up" point.

Additionally, the amplitude of output signal $QY_o$ is inversely proportional to the amplitude of input signal $Y_i$. In various applications, such inverse proportionality may cause problems. However, such problems may be compensated using automatic gain control circuits which keep the amplitude of input signal $Y_i$ relatively constant, or by utilizing hard limiters.

Unlike a conventional phase locked loop or frequency locked loop, inner loop 12 contains no voltage controlled oscillator. Thus, the inclusion of filters 26 causes inner loop 12 to behave similarly to only a first order phase locked loop when single pole low pass filters 26 are utilized. The effects of such filters prevent the dynamic performance of inner loop 12 from depending upon phase angle $p_1$. If such a filter exhibits a time constant T, then, a resulting closed loop time constant may be expressed as:

$$T/(4+Ga^2). \tag{10}$$

Due to signal characteristics of the feedback signal, a wide variety of higher order filters may not be used to achieve a higher order feedback loop. However, a second order response may be provided by adding outer feedback path 14, as shown in FIG. 1. This outer feedback path forms a conventional frequency locked loop. The resulting closed loop response of a signal acquisition apparatus utilizing inner loop 12 and an outer feedback path 14 exhibits a classical second order phase locked loop response.

Figure 4:
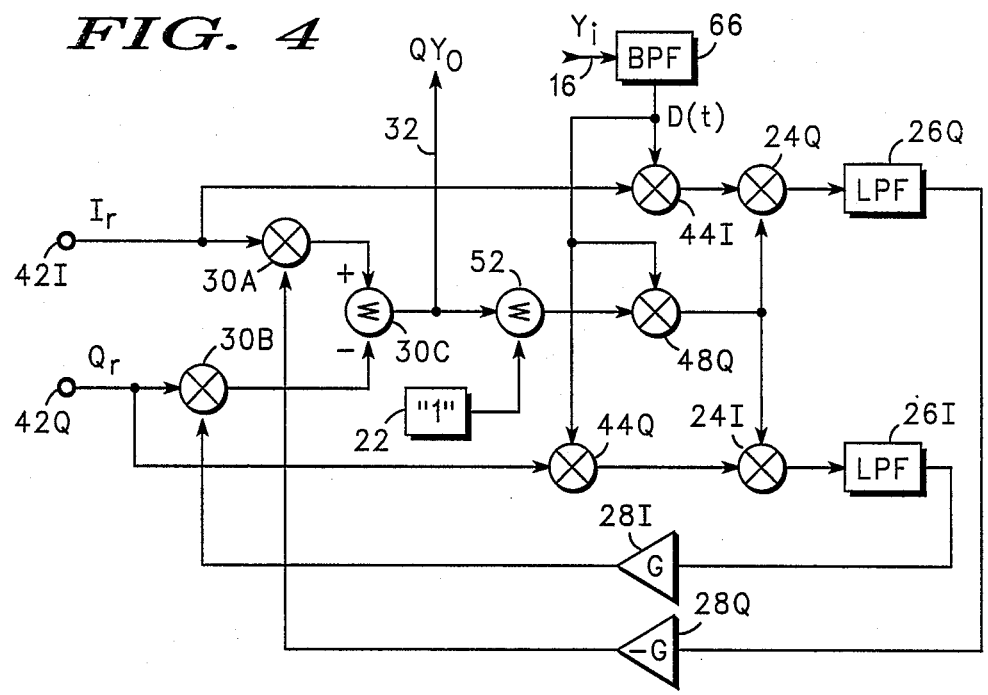
FIG. 4 shows a block diagram of a second embodiment of the present invention, which may be used in a modem symbol-clock acquisition application.

FIG. 4 shows another embodiment of the present invention. This embodiment of the present invention may be utilized in a clock-acquisition circuit which derives a clock signal from transmitted data. Thus, the input signal $Y_i$ represents digital data and the output signal substantially represents a sine wave. In this embodiment of the present invention, a complex reference signal is applied to terminals 42I and 42Q. Terminal 42I couples to a first input of a multiplier 30a and to a first input of multiplier 44I. Likewise, terminal 42Q couples to a first input of a multiplier 30b and a first input of multiplier 44Q. An output of multiplier 30a couples to a plus input of a summing device 30c, and an output of multiplier 30b couples to a minus input of summing device 30c. An output of summing device 30c couples to output terminal 32 and to the first input of summing device 52.

A constant value of 1.0 unit couples to the second input of summing device 52. In this embodiment, this constant 1.0 unit and summing device 52 provide the error estimation function. The output of summing device 52 couples to a first input of multiplier 48Q. Data input signal $Y_i$, from which the clock signal is acquired, is applied at terminal 16 which couples to an input of a band pass filter 66. An output of band pass filter 66 couples to second inputs of multipliers 44I, 44Q and 48Q. An output of multiplier 48Q couples to first inputs of multipliers 24I and 24Q. The output of multiplier 44I couples to a second input of multiplier 24Q, and the output of multiplier 44Q couples to a second input of multiplier 24I.

An output of multiplier 24Q couples to an input of low pass filter 26Q and the output of low pass filter 26Q couples to the input of amplifier 28Q. An output of multiplier 24I couples to the input of low pass filter 26I, and the output of low pass filter 26I couples to the input of amplifier 28I. In this embodiment, amplifier 28I exhibits a positive gain while amplifier 28Q exhibits a negative gain. The output of amplifier 28I couples to a second input of multiplier 30b, and the output of amplifier 28Q couples to a second input of multiplier 30a.

In this embodiment, multipliers 30a and 30b and summing device 30c together represent a phase rotator. Multipliers 44 perform a phase detection function and provide in-phase and quadrature first phase error signals at the outputs thereof. Additionally, multiplier 48Q performs a phase detection function and provides a net phase error signal at the output thereof, and multipliers 24I and 24Q represent a phase error combiner circuit.

Clock-acquisition circuits conventionally utilize a square law device prior to a phase-locked loop. The FIG. 4 embodiment of the present invention incorporates this square law operation within the feedback loop. The FIG. 4 embodiment eliminates low pass filters 46 and 50 which are included in the FIG. 2 embodiment. The filtering functions performed by low pass filters 46 and 50 in the FIG. 2 embodiment are performed by low pass filters 26 in the FIG. 4 embodiment and their removal allows incorporation of a square law device function within the feedback loop. Additionally, low pass filters 26 perform the primary loop time constant function for the FIG. 4 embodiment.

The feedback signals output from multipliers 24 are proportional to $D^2(t)$ where $D(t)$ represents the output from band pass filter 66. This $D^2(t)$ term may be approximated by:

$$D^2(t)=a[1-\sin(2Rt)] \tag{11}$$

where a represents the amplitude of the signal component at the clock frequency and R represents symbol rate. Using equation (11) and following a process similar to that described above in connection with FIG. 2, output $QY_o$ at output terminal 32 can be represented as:

$$QY_o=[aG/(2+aG)]\sin(R) \tag{12}$$

where G represents the gain of amplifiers 28.

In the FIG. 4 embodiment, output signal $QY_o$ is not a function of the phase difference between the reference signal and the input signal. Thus, acquisition of the input signal does not experience a quasi-stable lock point. Furthermore, output signal $QY_o$ is a sine wave exhibiting the symbol rate and having approximately a unity amplitude for large aG.

Input signal $Y_i$ need not be restricted to the input signals discussed above. The present invention may also be utilized in a carrier-acquisition application wherein a carrier represents input signal $Y_i$. Such a carrier may demonstrate both amplitude and phase modulation.

Figure 5:
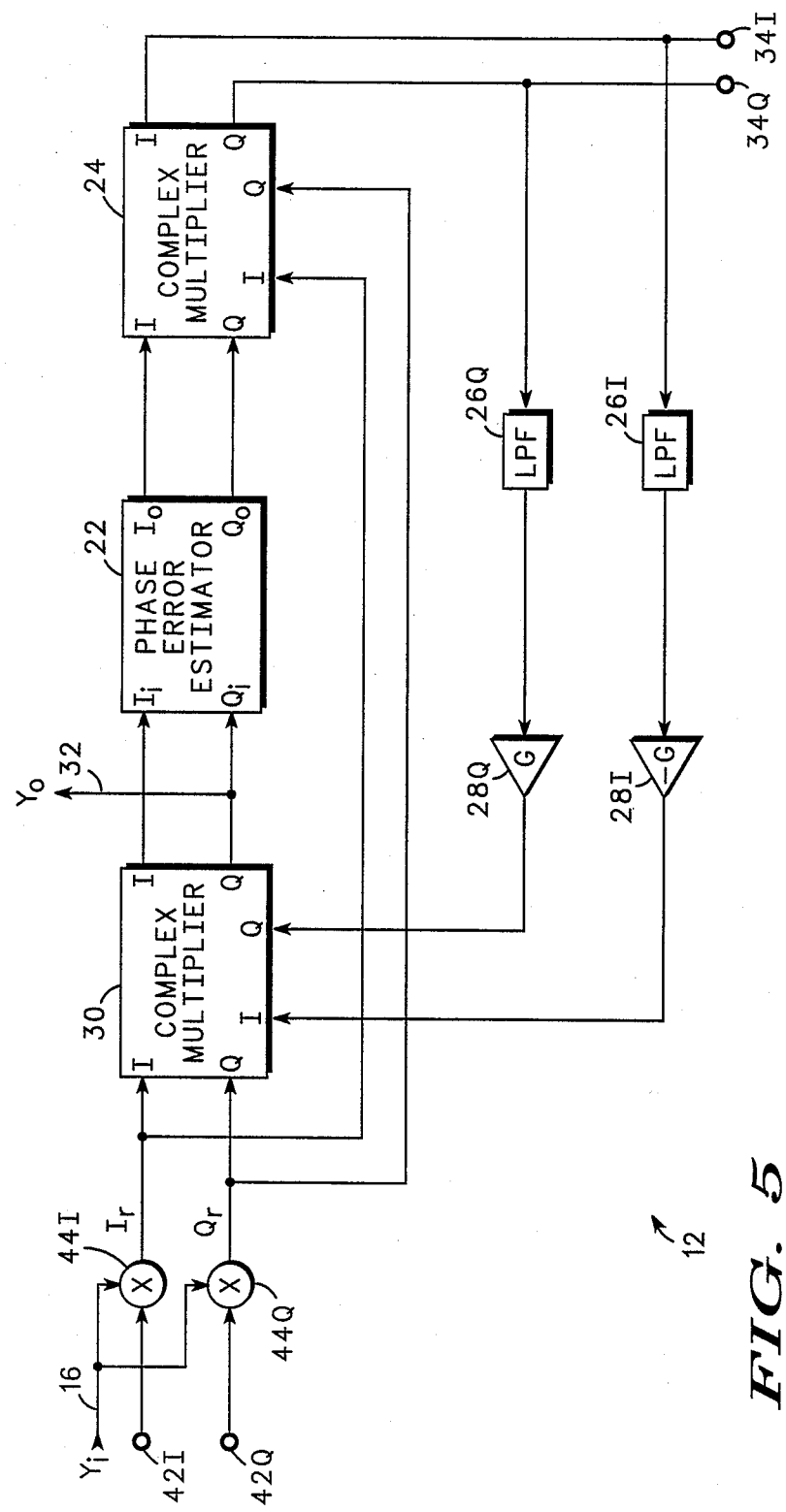
FIG. 5 shows a block diagram of a third embodiment of the present invention, which may be used in a carrier acquisition application.

FIG. 5 shows yet another embodiment of the present invention which may be particularly useful in such a carrier acquisition application. In the FIG. 5 embodiment, this input carrier signal is applied at terminal 16. Terminal 16 couples to first inputs of multipliers 44I and 44Q. Second inputs of multipliers 44I and 44Q couple to terminals 42I and 42Q, respectively. Multipliers 44I and 44Q together represent a complex phase detector. The output of multiplier 44I couples to a first in-phase input of complex multiplier 30 and a first in-phase input of complex multiplier 24. The output from multiplier 44Q couples to the first quadrature input of complex multiplier 30 and the first quadrature input of complex multiplier 24. The in-phase output of complex multiplier 30 couples to an in-phase input of phase error estimator 22. The quadrature output of complex multiplier 30 couples to a quadrature input of phase error estimator 22 and to terminal 32, which provides the output signal from this embodiment of the present invention. An in-phase output of phase error estimator 22 couples to the second in-phase input of complex multiplier 24, and a quadrature output of phase error estimator 22 couples to the second quadrature input of complex multiplier 24. The in-phase output of complex multiplier 24 couples to terminal 34I and to the input of low pass filter 26I. Likewise, the quadrature output of complex multiplier 24 couples to terminal 34Q and to the input of low pass filter 26Q. The output of low pass filter 26I couples to the input of amplifier 28I, and the output of low pass filter 26Q couples to the input of amplifier 28Q. The output of amplifier 28I couples to the second in-phase input of complex multiplier 30, and the output of amplifier 28Q couples to the second quadrature input of complex multiplier 30. In this embodiment of the present invention, complex multiplier 30 performs the phase rotation function, and complex multiplier 24 performs the phase error combination function.

In this embodiment of the present invention, an in-phase component of a reference signal is applied at terminal 42I and a quadrature component of the reference signal is applied at 42Q. The reference signal applied at terminals 42 could be generated using a voltage controlled oscillator such as that shown in outer feedback path 14 of FIG. 1. This reference signal mixes with the input carrier signal in multipliers 44 to produce a baseband signal $I_r$ at the output of multiplier 44I and $Q_r$ at the output of multiplier 44Q. $I_r$ and $Q_r$ represent demodulated I and Q phase signals which reflect the arbitrary phase difference between the instantaneous reference signal and the instantaneous carrier signal.

The $I_r$ and $Q_r$ signals are baseband signals which are rotated by complex multiplier 30 in response to a feedback signal generated by amplifiers 28. This feedback signal is generated by feedback loop 12 so that the resulting rotated, demodulated I and Q signals produced at the output of complex multiplier 30 are independent of the arbitrary phase difference between the carrier signal and the reference signal.

This embodiment of the present invention differs from the embodiment described above in connection with FIG. 2 in that only multipliers 44 operate at the frequency of the input signal. In the present embodiment, rotator 30 operates at a baseband frequency rather than at the frequency of the input signal which is being acquired by loop 12.

Phase error estimator 22 may be represented by any one of several different estimation configurations. However, improved acquisition performance may be obtained by matching the design of phase error estimator 22 to the anticipated type of modulation exhibited by the carrier signal input at terminal 16. FIGS. 6a–6c show different embodiments of phase error estimator 22. The embodiment of phase error estimator 22 shown in FIG. 6a represents a phase error estimator that may advantageously be used when inner loop 12 acquires a substantially pure carrier input signal (ie. no modulation). In FIG. 6a, in-phase input $I_i$ couples to a first input of summing device 52 and a constant DC bias value of 1.0 unit couples to a second input of summing device 52.

The output of summing device 52 couples to in-phase output $I_o$. Additionally, quadrature output $Q_o$ couples directly to quadrature input $Q_i$.

The embodiment of phase error estimator 22 shown in FIG. 6b is particularly useful when loop 12 acquires a BPSK modulated carrier signal. In BPSK carrier modulation the smallest increment of phase modulation is 180°. Accordingly, in-phase input $I_i$ couples to an input of a limiter 51 and to the + input of summing device 52. An output of limiter 51 couples to the − input of summing device 52, and the output of summing device 52 couples to in-phase output $I_o$. Additionally, for BPSK modulation, quadrature output $Q_o$ couples directly to in-phase input $Q_i$.

FIG. 6c shows a phase error estimator 22 which is suitable for use in QPSK, offset QPSK, and MSK types of carrier modulation. In this embodiment of phase error estimator 22, the input $I_i$ couples to an input of a limiter 51a and to a + input of a summing device 52a. An output of limiter 51a couples to a − input of summing device 52a, and an output of summing device 52a couples to in-phase output $I_o$. Likewise, quadrature input $Q_i$ couples to an input of a limiter 51b and to a + input of a summing device 52b. An output of limiter 51b couples to a − input of summing device 52b, and an output of summing device 52b couples to quadrature output $Q_o$.

Referring back to FIG. 5, complex multiplier 24 multiplies the complex conjugate of the original demodulated $I_r$ and $Q_r$ signals by the estimated phase error signal produced by phase error estimator 22. The output of complex multiplier 24 is filtered and amplified and utilized as a feedback signal which controls the phase rotation produced by complex multiplier 30. Following a process similar to that described above in connection with FIG. 2, it can be shown that the output signal $Y_o$ at terminal 32 can be acquired independently of a particular arbitrary phase angle exhibited by the reference signal applied at terminals 42.

In summary, the present invention does not exhibit a quasi-stable point during signal acquisition because the phase acquisition and tracking circuit output signal is independent of the phase difference between the reference signal and the input signal. A rapid signal acquisition results. Additionally, phase estimation, phase rotation, phase comparison, and combining circuits all form a part of a negative feedback loop. Thus, non-linearities and other errors produced by the multipliers and summing devices which make up these circuit components are compensated for through the negative feedback. An output signal which faithfully reproduces the acquired input signal results.

The present invention is described above with reference to particular embodiments which facilitate teaching this invention. Those skilled in the art will recognize that many alternative embodiments also fall within the scope of the present invention. For example, the above description referred to various polarities within complex multipliers, amplifiers, and summing circuits. Those skilled in the art will recognize that alternative devices and connections between devices may be used to reverse polarities associated with virtually all devices discussed above. Likewise, the use of summing devices will be understood by those skilled in the art to include both addition and subtraction devices. Furthermore, those skilled in the art of feedback loops will understand that particular gains and constant values discussed above do not represent critical parameters in the present invention, but may withstand a wide variation. Still further, those skilled in the art will recognize that particular functions used by error estimator 22 are not critical to the implementation of the present invention. Rather, a wide variation in functions may occur while still permitting acquisition circuit 10 to acquire an input signal more rapidly than a corresponding conventional phase locked loop. These and other changes and modifications to the above-described preferred embodiments which are obvious to those skilled in the art are intended to be included within the scope of the present invention.

I claim:

1. An apparatus for acquiring an input signal, said apparatus comprising:
   first means for comparing phase, said first comparing means having a signal input adapted to receive the input signal, a reference input, and an output for providing a first phase error signal;
   second means for comparing phase, said second comparing means having a signal input coupled to said first comparing means signal input, a reference input, and an output for providing a net phase error signal;
   means, coupled to said first comparing means reference input, for providing a reference signal which exhibits a first phase angle relative to the input signal;
   means, having a first input coupled to said providing means output, a second input, and an output coupled to said second comparing means reference input, for rotating the first phase angle of the reference signal by a second phase angle;
   means for estimating error between the first and second phase angles, said estimating means being coupled to said second comparing means; and
   means, having first and second inputs coupled to said first and second comparing means outputs, respectively, and an output coupled to said phase rotating means second input, for combining the first phase error signal and the net phase error signal into a feedback signal which is a function of the first and second phase angles.

2. An apparatus as claimed in claim 1 wherein said estimating means comprises:
   means for supplying a constant value; and
   a summing device having a first input and an output coupled in series between said rotating means output and said combining means second input and having a second input coupled to said supplying means.

3. An apparatus as claimed in claim 1 additionally comprising a low pass filter coupled in series between said combining means output and said rotating means second input.

4. An apparatus as claimed in claim 3 additionally comprising an amplifier coupled in series with said low pass filter between said combining means output and said rotating means second input.

5. An apparatus as claimed in claim 4 wherein:
   said first comparing means includes a second low pass filter coupled in series with said combining means first input; and
   said second comparing means includes a third low pass filter coupled in series with said combining means second input.

6. An apparatus as claimed in claim 1 wherein said providing means comprises a variable frequency oscillator having a control input coupled to said combining means output.

7. An apparatus as claimed in claim 1 wherein said providing means output and said combining means output each have an in-phase component and a quadrature component, and said rotating means comprises:
   a first multiplier having a first input coupled to the in-phase component of said providing means output, a second input coupled to the quadrature component of said combining means output, and an output;
   a second multiplier having a first input coupled to the quadrature component of said providing means output, a second input coupled to the in-phase component of said combining means output, and an output, and
   a summing device having a first input coupled to said first multiplier output, a second input coupled to said second multiplier output, and an output.

8. An apparatus as claimed in claim 1 wherein said providing means output and said combining means output each have an in-phase component and a quadrature component, and wherein:
   said rotating means comprises a full complex multiplier having a first in-phase input coupled to the in-phase component of said providing means output, a first quadrature input coupled to the quadrature component of said providing means output, a second in-phase input coupled to the in-phase component of said combining means output, a second quadrature input coupled to the quadrature component of said combining means output, an in-phase output, and a quadrature output;
   said first comparing means comprises,
      a first multiplier having a first input adapted to receive the input signal, a second input coupled to the in-phase component of said providing means output, and an output,
      a second multiplier having a first input adapted to receive the input signal, a second input coupled to the quadrature component of said providing means output, and an output; and
   said second comparing means comprises,
      a third multiplier having a first input adapted to receive the input signal, a second input coupled to said full complex multiplier in-phase output, and an output, and
      a fourth multiplier having a first input adapted to receive the input signal, a second input coupled to said full complex multiplier quadrature output, and an output.

9. An apparatus as claimed in claim 8 wherein said combining means comprises a second full complex multiplier having a first in-phase input coupled to said first multiplier output, a first quadrature input coupled to said second multiplier output, a second in-phase input coupled to said third multiplier output, a second quadrature input coupled to said fourth multiplier output, an in-phase output which supplies the in-phase component of said combining means output, and a quadrature output which supplies the quadrature component of said combining means output.

10. A method of acquiring an input signal, said method comprising the steps of:
   rotating a phase of a reference signal in response to a feedback signal to provide a rotated reference signal;

detecting a first phase difference between the reference signal and the input signal to provide a first phase error signal;

detecting a second phase difference between the rotated reference signal and the input signal to provide a net phase error signal;

estimating error between the first and second phase differences to provide an error estimate signal, and wherein said detecting a second phase difference step comprises the step of forming the net phase error signal in response to the error estimate signal; and combining the first phase error signal and the net phase error signal to provide the feedback signal so that the feedback signal is a function of the first and second phase differences.

11. A method as claimed in claim 10 wherein said estimating step comprises the step of supplying an estimate signal which exhibits a constant value.

12. A method as claimed in claim 10 additionally comprising the step of filtering and amplifying the feedback signal.

13. A method as claimed in claim 12 wherein:
said detecting a first phase error step includes the step of filtering the first phase error signal; and
said detecting a second phase error step comprises the step of filtering the net phase error signal.

14. A method as claimed in claim 10 wherein the reference signal exhibits in-phase and quadrature components, the feedback signal exhibits in-phase and quadrature components, and said rotating step comprises the steps of:
multiplying the in-phase component of the reference signal by the quadrature component of the feedback signal to provide a first product signal;
multiplying the quadrature component of the reference signal by the in-phase component of the feedback signal to provide a second product signal; and
summing the first and second product signals together.

15. An apparatus for acquiring an input signal, said apparatus comprising:
a first input terminal adapted to receive the input signal;
a second input terminal adapted to receive an in-phase component of a reference signal;
a third input terminal adapted to receive a quadrature component of the reference signal;
a first multiplier having a first input coupled to said second terminal, a second input, and an output;
a second multiplier having a first input coupled to said third terminal, a second input, and an output;
a summing device having a first input coupled to said first multiplier output, a second input coupled to said second multiplier output, and an output for providing a rotated reference signal;
a third multiplier having a first input coupled to said second terminal, a second input coupled to said first terminal, and an output;
a fourth multiplier having a first input coupled to said third terminal, a second input coupled to said first terminal, and an output;
means for estimating error between the reference signal phase and the rotated reference signal phase;
a second summing device having a first input coupled to said estimating means, a second input, and an output;
a fifth multiplier having a first input coupled to one of said second summing device output and said first summing device output, a second input coupled to said first terminal, and an output, and wherein said second summing device second input couples to one of said first summing device output and said fifth multiplier output;
a sixth multiplier having a first input coupled to said third multiplier output, a second input coupled to one of said fifth multiplier output and said second summing device output, and an output;
a seventh multiplier having a first input coupled to said fourth multiplier output, a second input coupled to one of said fifth multiplier output and said second summing device output, and an output;
a first low pass filter;
a second low pass filter;
a first amplifier coupled in series with said first low pass filter between said sixth multiplier output and said first multiplier second input; and
a second amplifier coupled in series with said second low pass filter between said seventh multiplier output and said second multiplier second input.

16. An apparatus for acquiring and tracking an input signal, said apparatus comprising:
means, having a first input which receives a first signal corresponding to the input signal, a second input which receives a feedback signal, and an output which provides a rotated signal, for rotating a phase parameter of the first signal by an amount which corresponds to the feedback signal;
means, having an input coupled to the output of said rotating means and an output, for estimating error of the rotated signal; and
means, having a first input coupled to the output of said estimating means, a second input coupled to the first input of said rotating means, and an output coupled to the second input of said rotating means, for combining the first signal and the signal output from said estimating means to produce the feedback signal.

17. An apparatus as claimed in claim 16 wherein said rotating means comprises a complex multiplier and said combining means comprises a complex multiplier.

18. An apparatus as claimed in claim 17 additionally comprising a phase detector having a first input adapted to receive the input signal, a second input adapted to receive a reference signal, and an output coupled to the first input of said rotating means.

* * * * *